United States Patent [19]

Townsend et al.

[11] Patent Number: 5,599,369
[45] Date of Patent: Feb. 4, 1997

[54] HOOD FOR METAL-OXIDE VAPOR COATING GLASS CONTAINERS

[75] Inventors: Harry O. Townsend, Perrysburg; Joseph E. Olsavsky, Waterville; Dana L. Meissner, Toledo, all of Ohio

[73] Assignee: Owens-Brockway Glass Container Inc., Toledo, Ohio

[21] Appl. No.: 236,280

[22] Filed: Apr. 29, 1994

[51] Int. Cl.⁶ .................... C03C 17/09; C23C 16/00
[52] U.S. Cl. ................ 65/157; 65/60.1; 65/60.5; 118/720; 118/729; 118/602; 427/255
[58] Field of Search .................... 65/30.1, 60.1, 65/60.4, 60.52, 60.7, 111, 157, 375; 118/720, 729, 730, 602, 603, 300, 324, 326; 427/255, 251, 255.5

[56] References Cited

U.S. PATENT DOCUMENTS

| | | | |
|---|---|---|---|
| Re. 28,076 | 7/1974 | Augustsson et al. | 118/720 |
| 3,353,514 | 11/1967 | Lyle | 65/30.1 |
| 3,438,803 | 4/1969 | Dubble et al. | 427/255 |
| 3,516,811 | 6/1970 | Gatchet et al. | 65/30.1 |
| 3,684,469 | 8/1972 | Goelzer et al. | 65/60.3 |
| 3,688,737 | 9/1972 | Augustsson et al. | 118/720 |
| 3,819,404 | 6/1974 | Scholes et al. | 65/60.52 |
| 3,933,457 | 1/1976 | Scholes | 65/157 |
| 4,201,562 | 5/1980 | Hofmann et al. | 427/255 |
| 4,220,118 | 9/1980 | Levene et al. | 118/720 |
| 4,389,234 | 6/1983 | Lindner | 65/60.1 |
| 4,668,268 | 5/1987 | Lindner et al. | 65/60.1 |
| 4,898,116 | 2/1990 | Kozoe et al. | 118/621 |
| 5,056,460 | 10/1991 | Vohringer | 118/634 |
| 5,078,081 | 1/1992 | Kustermann | 118/119 |
| 5,140,940 | 8/1992 | Lindner | 118/724 |

Primary Examiner—Peter Chin
Assistant Examiner—Steven P. Griffin

[57] ABSTRACT

An apparatus for applying a metal-oxide coating to hot, freshly formed glass containers. The apparatus includes a tunnel including spaced apart sidewalls, a conveyor for conveying hot, freshly formed glass containers through said tunnel, and a vapor distributor. The vapor distributor includes a series of alternating vapor inlets and vapor outlets arranged along each side wall of the tunnel. Each vapor inlet along one side wall of the tunnel is positioned opposite to a vapor outlet on the other side of the tunnel. Moreover, each vapor inlet and vapor outlet has a pivoted baffle positioned internally thereof, the pivoting of the baffle being effective to vary the vertical extent of an opening of the inlet and the outlet, and each vapor outlet having an adjustable flow divider internally thereof for dividing the vapor flowing into the vapor outlet into a first portion to be exhausted from the tunnel and a second portion to be recirculated through the vapor inlet into the tunnel.

14 Claims, 6 Drawing Sheets

HOOD FOR METAL-OXIDE VAPOR COATING GLASS CONTAINERS

FIELD OF THE INVENTION

This invention relates to a hood for coating glass containers with a metal-oxide vapor. More particularly, this invention relates to a hood for vapor coating of glass containers to provide a uniform metal-oxide coating thickness on the container sidewalls and to control the metal-oxide coating on the finish of the glass container.

BACKGROUND OF THE INVENTION

This invention is concerned with a hood for vapor coating glass containers to control the amount and placement of the metal-oxide coating on the container sidewalls and finish of the glass containers. In the past, the amount and placement of a coating, e.g., tin oxide, on the finish of a glass container has been difficult to control resulting in excessive coating on the finish of the glass container. This problem of excessive metal-oxide coating on the finish of a glass container occurs during a coating process wherein tin tetrachloride ($SnCl_4$) vapors flow over and chemically react with the hot surfaces of the glass container.

The desirability of applying a metal-oxide coating to the exterior of a glass container has long been recognized. Such coatings, which include tin, titanium, or other reactive metallic compounds, or organometallic compounds, protect the glass container from surface damage, such as abrasions and scratches, which result in a loss of tensile strength for the glass container. The need for high tensile strength in a glass container is particularly acute when containers are mass produced, move rapidly in close proximity along high speed conveyor lines, and are subsequently filled with carbonated beverages, beer, wine, foodstuffs and the like that produce gaseous pressure within the container.

The metal-oxide coating is typically applied when the glass container emerges in a heated, fully shaped condition from a glassware forming machine, that is at the "hot end" of the system. The containers are transported away from the forming machine by a conveyor. Temperatures in excess of 400 degrees Centigrade exist at the surface of the glass containers, so that when a heat decomposable inorganic metallic, or organometallic, compound is applied thereto, the compound reacts immediately and is converted to a metal-oxide coating.

One well known and previously used technique for applying a metal-oxide coating to the hot glass containers calls for spraying the opposite sides of the containers as they travel on a conveyor, in single file, through two longitudinally spaced, oppositely positioned spray heads. Each spray head covers approximately 180 degrees of the circumference of the bottle, so that at least two spraying stations are required to coat the entire glass container. Receivers are positioned at the opposite sides of the conveyor in alignment with the spray heads. Pressurized air with the coating compound entrained therein is discharged from each spray head at a significant pressure, while the receivers are usually maintained at a relatively low pressure. The resultant pressure differential increases the velocity, and thus the effectiveness, of the coating-precursor compound. Coating systems of this nature are disclosed, inter alia, in U.S. Pat. No. 3,516,811, to Gatchet, et al., and U.S. Pat. No. 3,684,469, to Goetzer, et al.

Gatchet, et al. recognized that the deposition of a metal-oxide coating on the finish of the glass container passing on a conveyor through the open-sided coating apparatus of the prior art was undesirable, as noted in column 3, lines 21–57 of U.S. Pat. No. 3,516,811. Gatchet, et al. relied upon spray heads producing a theoretically laminar flow which would pass laterally across the width of the conveyor to control the location as well as the uniformity of the metal-oxide deposit, as shown in FIG. 4 of that patent.

The above-described coating systems, however, are what may be termed "open-sided", and are thus adversely influenced by ambient conditions in the facility where the glass containers are formed. The ambient conditions of prime concern are rapidly-moving air currents, moisture in the air, and the potentially toxic and corrosive fumes and pollutants being discharged from the spray heads. Air currents can cause turbulent conditions at the spray heads, which can in turn result in a preferential or uneven application of the protective coating. Some of the coating will therefore accumulate on the bottle "finish", the term used in the industry to designate the closure region of the bottle. The rapidly-moving air currents disrupt the laminar-flow patterns which are theoretically possible with open-sided systems, and the capability for uniformly, and consistently, applying the same thickness of coating is seriously reduced.

To compensate for air currents as described above, the systems are therefore operated at higher pressures, and with the use of greater amounts of coating compound, than would be required under quiescent conditions. The necessary result of process adjustments such as these is the use of greater amounts of coating compound than required for optimum economy.

The moisture in the hostile atmosphere described above causes hydrolysis loss, thus rendering some of the compound unfit for its intended purpose. Further, the escape of potentially toxic fumes into the atmosphere at the work place can constitute an occupational health hazard, and may also be a violation of applicable law. These fumes are also generally quite corrosive, and can attack various components of the glass factory, such as, e.g., blowers, exhaust systems, conveyors and roofs, obviously leading to increased plant-maintenance costs. Additionally, the efficiency of these open-sided systems is low, since much of the relatively expensive coating compound is wasted.

A second, well-known, and widely employed technique for applying a metal-oxide coating to hot glass containers relies upon a formed sheet-metal coating hood with spray heads and associated receivers situated therein. The hood obviates many of the problems associated with the open-ended spray systems discussed above. For example, it isolates the glass containers from ambient conditions, and furnishes a more controlled atmosphere, which enhances the coating operations. The hood includes an exhaust system which captures most of the air-entrained coating compound not adhering to the containers, thus reducing the problem of venting the system and minimizing the opportunity for the coating compound to attack building components. Also, the hood can significantly raise the coating efficiency of the systems, with attendant cost savings.

Coating hoods substantially representative of the prior art are disclosed in U.S. Pat. No. 3,819,404 to Scholes et al.; U.S. Pat. No. 3,933,457, to Scholes; and U.S. Pat. No. 4,389,234 to Lindner. The most recent patent to Lindner, et al. presents a coating hood including a tunnel for allowing containers to pass therethrough, and a vertically adjustable flat roof for accommodating containers of various sizes. At least two jet slots are located in each side wall, and at least two receivers or suction slots are aligned therewith. The jet and suction slots are interspersed opposite each other in each side wall. The coating compound is introduced through at least one feedpoint, and blowers secured to the side walls furnish an inner and an outer loop of high-velocity air, of which the inner loop contains the coating compound, to the interior of the hood. Baffles are situated in the flow path of the high-velocity air so that the jets issuing from the jet slots are well defined, and thus better suited for their intended function.

It will be appreciated from the foregoing that there is still a significant need for an improved apparatus for coating glass containers. Accordingly, one aspect of the present invention is to provide an apparatus that is capable of applying a consistent coating thickness about the circumference and height of a glass container. Another aspect of the present invention is to provide an apparatus for vapor coating glass containers to control the amount and placement of a metal-oxide coating on the sidewalls and the finish of a glass container. Another aspect of the present invention is to provide an apparatus for applying a metal-oxide coating to hot, freshly formed glass containers that may operate under a wide range of process conditions on a variety of different types and sizes of glass containers. Yet another aspect of the present invention is to provide an apparatus for applying a metal-oxide coating to glass containers that is simple and economical to operate.

SUMMARY OF THE INVENTION

Briefly, according to the present invention there is provided an apparatus for applying a metal-oxide coating to hot, freshly formed glass containers. The apparatus includes a tunnel including spaced apart sidewalls, a conveyor for conveying hot, freshly formed glass containers through the tunnel, and a vapor distributor. The vapor distributor includes a series of alternating vapor inlets and vapor outlets arranged along each side wall of the tunnel. Each vapor inlet along one side wall of the tunnel is positioned opposite to a vapor outlet on the other side of the tunnel. Moreover, each vapor inlet and vapor outlet has a pivoted baffle positioned internally thereof, the pivoting of the baffle being effective to vary the vertical extent of an opening of the inlet and the outlet, and each vapor outlet having an adjustable flow divider internally thereof for dividing the vapor flowing into the vapor outlet into a first portion to be exhausted from the tunnel and a second portion to be recirculated through the vapor inlet into the tunnel.

BRIEF DESCRIPTION OF THE DRAWINGS

Further features and other objects and advantages of this invention will become clear from the following detailed description made with reference to the drawings in which.

DESCRIPTION OF THE PREFERRED EMBODIMENTS

Referring to the drawings, wherein like reference characters represent like elements, FIGS. 1–7 show a hood 10 for metal-oxide vapor coating glass containers 12. Generally, the hood 10 includes at least two side walls 14 and a roof 16 which form an elongate tunnel 18 through which freshly formed glass containers 12 pass in single file on a conveyor 20. The conveyor 20 used to transport the glass containers 12 through the hood 10 is of a conventional design well known in the art.

The side walls 14 of the hood 10 are positioned along each side of the conveyor 20 and are fastened to brackets 22 forming part of the supporting structure for the conveyor. Holes 24 are formed in the brackets 22 and slots 26 are formed in the supporting frame of each side wall 14 to receive a fastener 28 which is fastened through the respective slots and holes to fasten the side walls to the bracket such that the width of the tunnel 18 formed between the side walls may vary to accommodate a variety of glass container sizes. In considering the figures it will be appreciated that only one side wall 14 of the hood 10 will be described in detail for purposes of clarity in view of the similarity of construction of each side wall of the hood.

Referring to FIGS. 1–7, each side wall 14 of the hood 10 includes an air distributor 30. The air distributor 30 distributes a vapor containing a circulating carrier gas, e.g., air, with a vaporized metal compound and causes the vaporized metal compound to impinge on the glass container 12 surface and form a metal-oxide film on the surface thereof. The metal compound is preferably tin tetrachloride, although other metal compounds known to be useful can also be employed. For example, titanium tetrachloride, tetraisopropyl titanate, and a variety of other inorganic and metallo-organic compounds have been employed in the past to provide metal-oxide coatings on glass containers.

Figure 1:
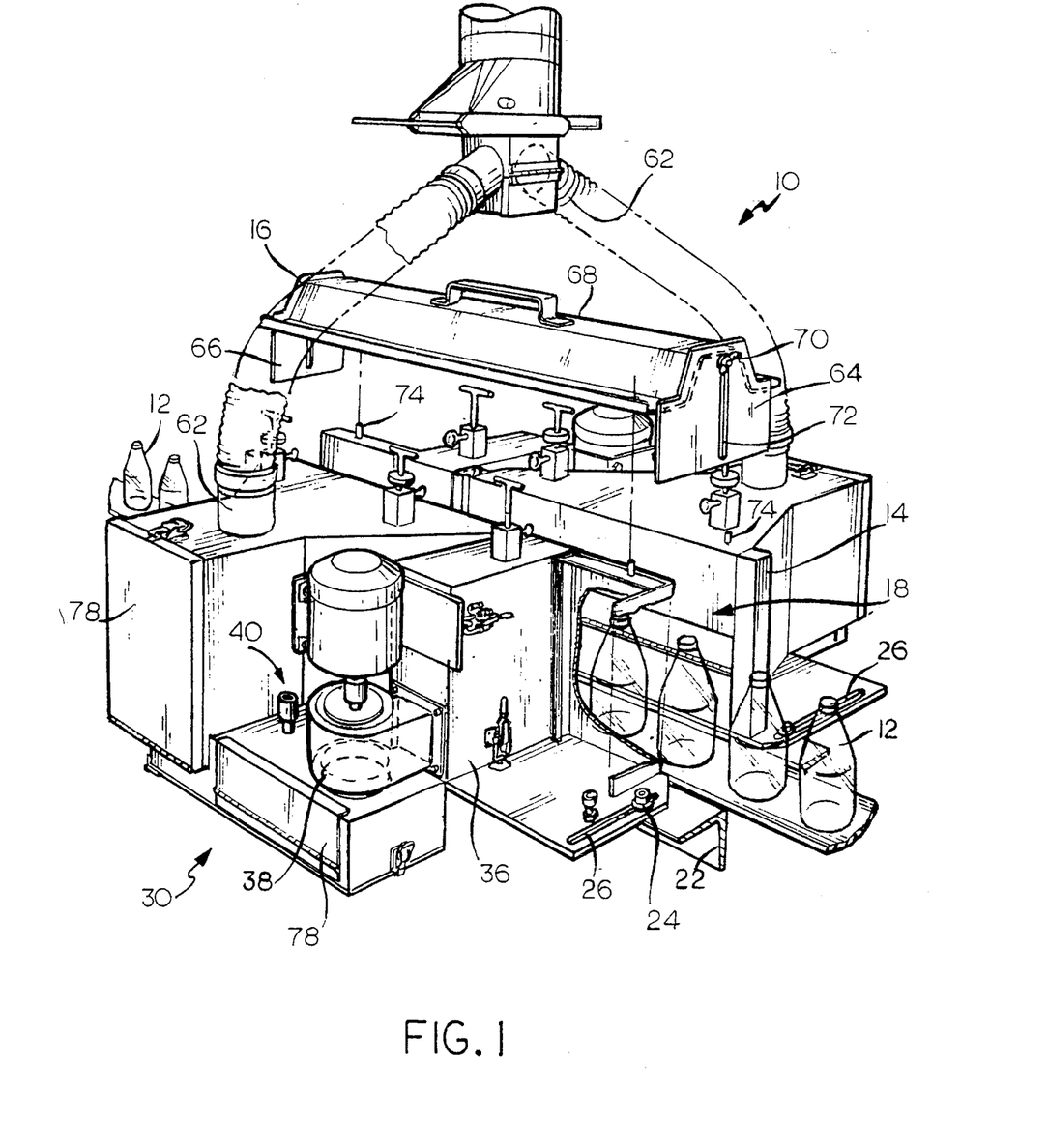
FIG. 1 is a partially exploded perspective view of a hood for coating glass containers with metal-oxide in accordance with the present invention.
Figure 2:
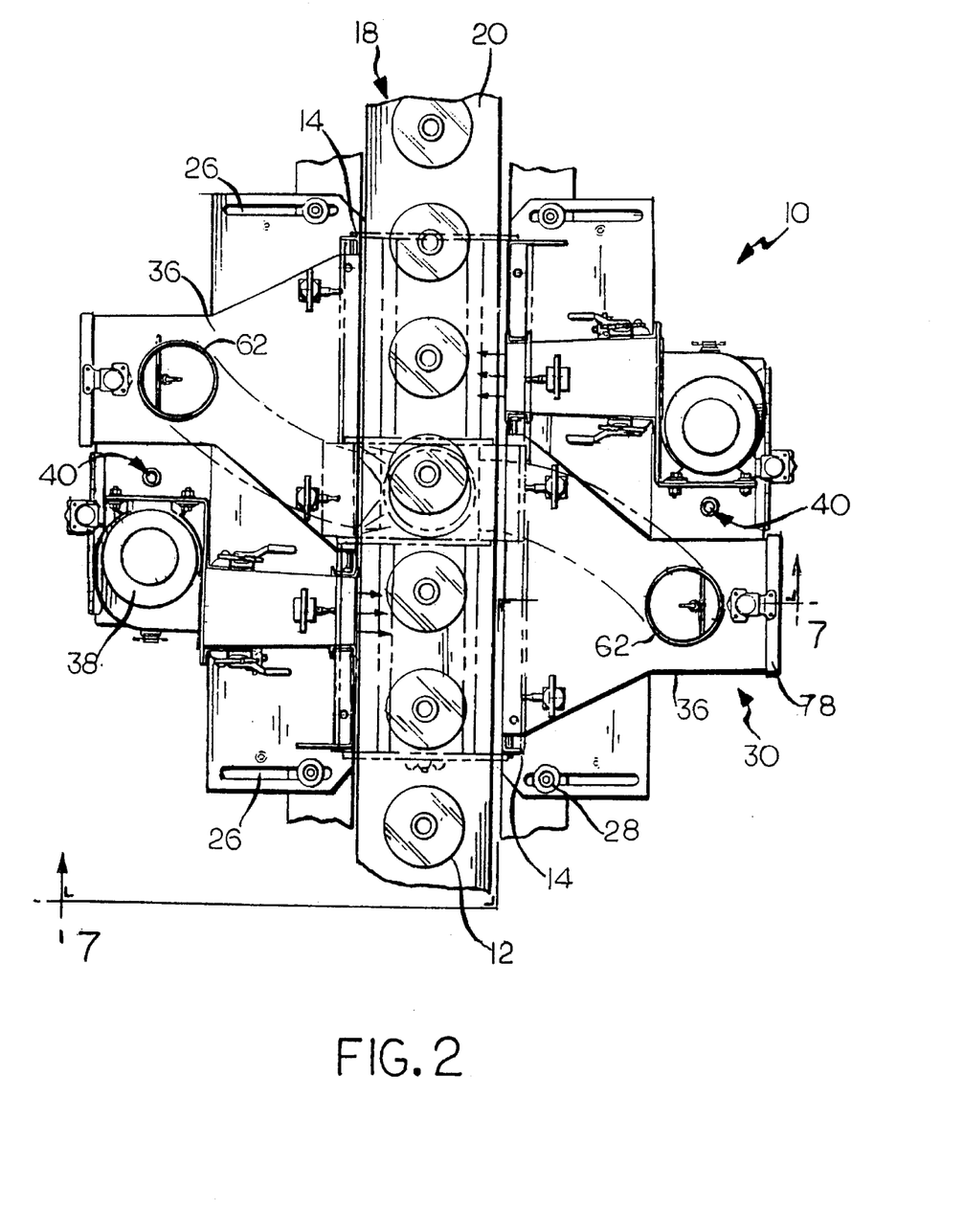
FIG. 2 is a top view of the hood of FIG. 1.

The air distributor 30 of each side wall 14 includes a series of alternating vapor inlets 32 and vapor outlets 34. Each vapor inlet 32 is in communication with a vapor outlet 34 through a duct system 36 having a motor driven blower 38 of a type well known in the art to recirculate vapors from the tunnel 18 through the vapor outlet and out the vapor inlet into the tunnel. As shown in FIG. 1, the vapor inlet 32 and vapor outlet 34 of each side wall 14 are positioned across from a corresponding vapor outlet and vapor inlet of an opposing side wall to allow the vapor to circulate from a vapor inlet of one side wall across a glass container 12 and into a vapor outlet of an opposing side wall through the duct system 36 and out the vapor inlet and across another glass container and into the vapor outlet of the side wall. The metal compound concentration of the recirculating vapor may be replenished as needed by introducing metal compound into the duct system 36 at feedpoint 40. The metal compound is vaporized upon contact with circulating carrier gas which has been heated above the vaporization temperature of the metal compound.

The vapor inlet 32 is located adjacent and preferably contiguous the vapor outlet 34 to reduce the amount of unused side wall 14 between the vapor inlet and the vapor outlet thereby eliminating areas of vapor flow previously encountered between an opposing vapor inlet and vapor outlet. In addition, the width of the opening of a vapor outlet 34 of a side wall 14 is substantially wider than the width of the opening of a vapor inlet 32 to substantially capture the vapor cross flow from the vapor inlet. It will be appreciated that the size and positioning of the vapor inlet 32 and outlet 34 reduces any "dead space", a flat portion on the side wall 14 which contributes to turbulent vapor flow within the hood 10 thereby adversely affecting the control and application of metal-oxide to the glass container 12.

Figure 7:
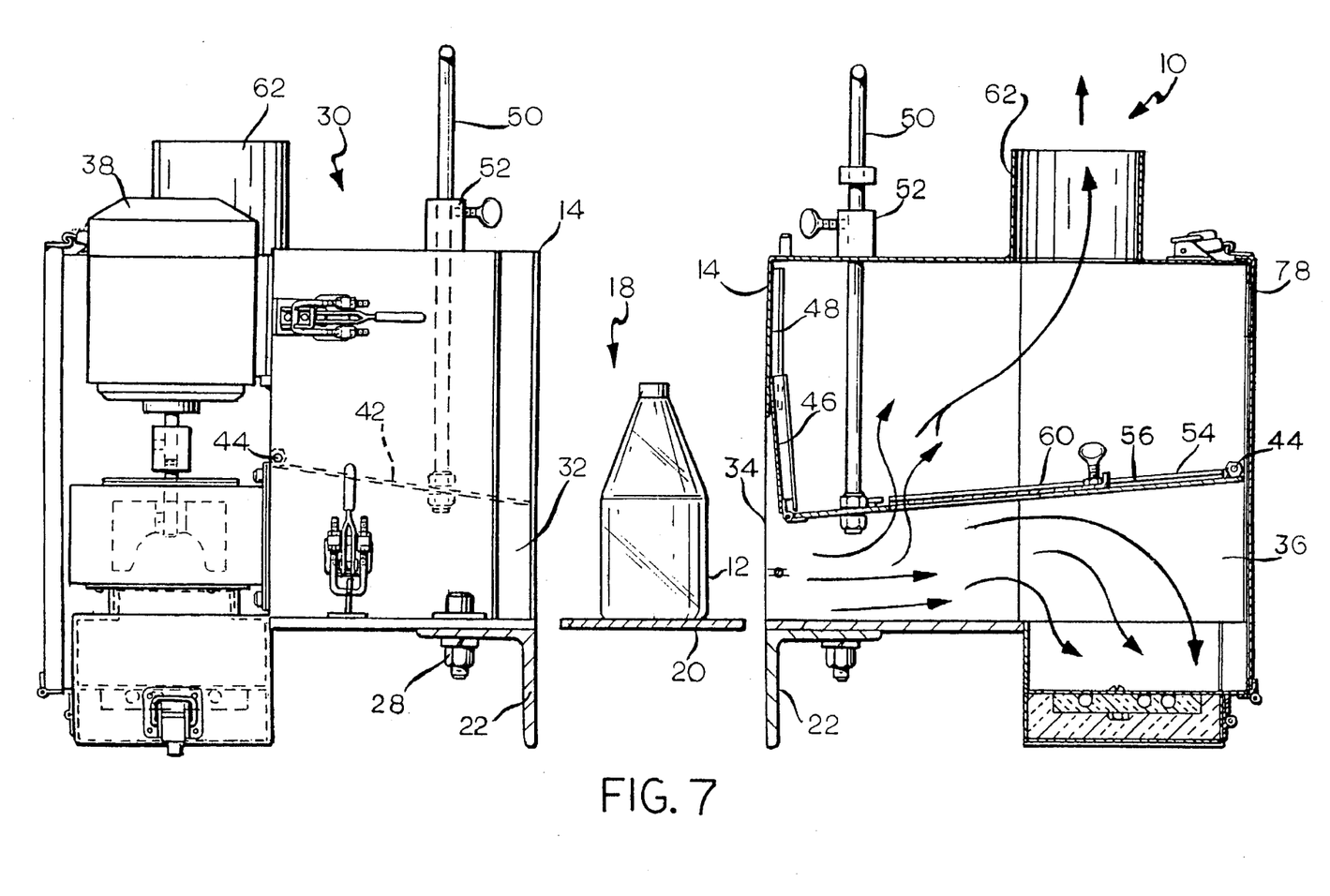
FIG. 7 is a sectional view of the hood of FIG. 2 taken along line 7—7.

It is a feature of the hood 10 that a higher percentage of the vapor impinges below the container 12 finish than previously possible. Accordingly, the vapor inlet 32 and the vapor outlet 34 each include a baffle 42 positioned internally thereof and pivotal about an axis effective to vary the vertical extent of the vapor inlet height opening and vapor outlet height opening as a function of the height of glass container 12 conveyed within the hood 10 to deter application of metal-oxide to the finish of the glass container. As shown in FIG. 7, each baffle 42 is pivotally fixed about a rod 44 extending through the sides of the air distributor 30 and hingedly connected about a front plate 46 which slides within two vertical channels 48. A rod 50 is fixed to the top of the baffle 42 and extends from the baffle through the top of the air distributor 30. The position of the baffle 42 and vertical height of the opening may be adjusted by moving the rod 50 vertically and then fixing a clamp 52 on the rod to prevent the rod from moving with respect to the top of the air distributor 30.

It will be appreciated that by adjusting the location of the clamp 52 on the rod 50, the vertical height of the opening of the vapor outlet 34 may be adjusted for the height of the glass container 12 such that vapor is drawn from the tunnel 18 by the blower 38 and exhaust system 62 and pulled down and away from the finish. Moreover, by adjusting the vertical height of the opening of the vapor inlet 32 for the height of the glass container 12 the vapor is deflected and introduced to the tunnel 18 and across the glass container at a height to prevent unwanted buildup of the metal-oxide coating on the finish.

Figure 3:
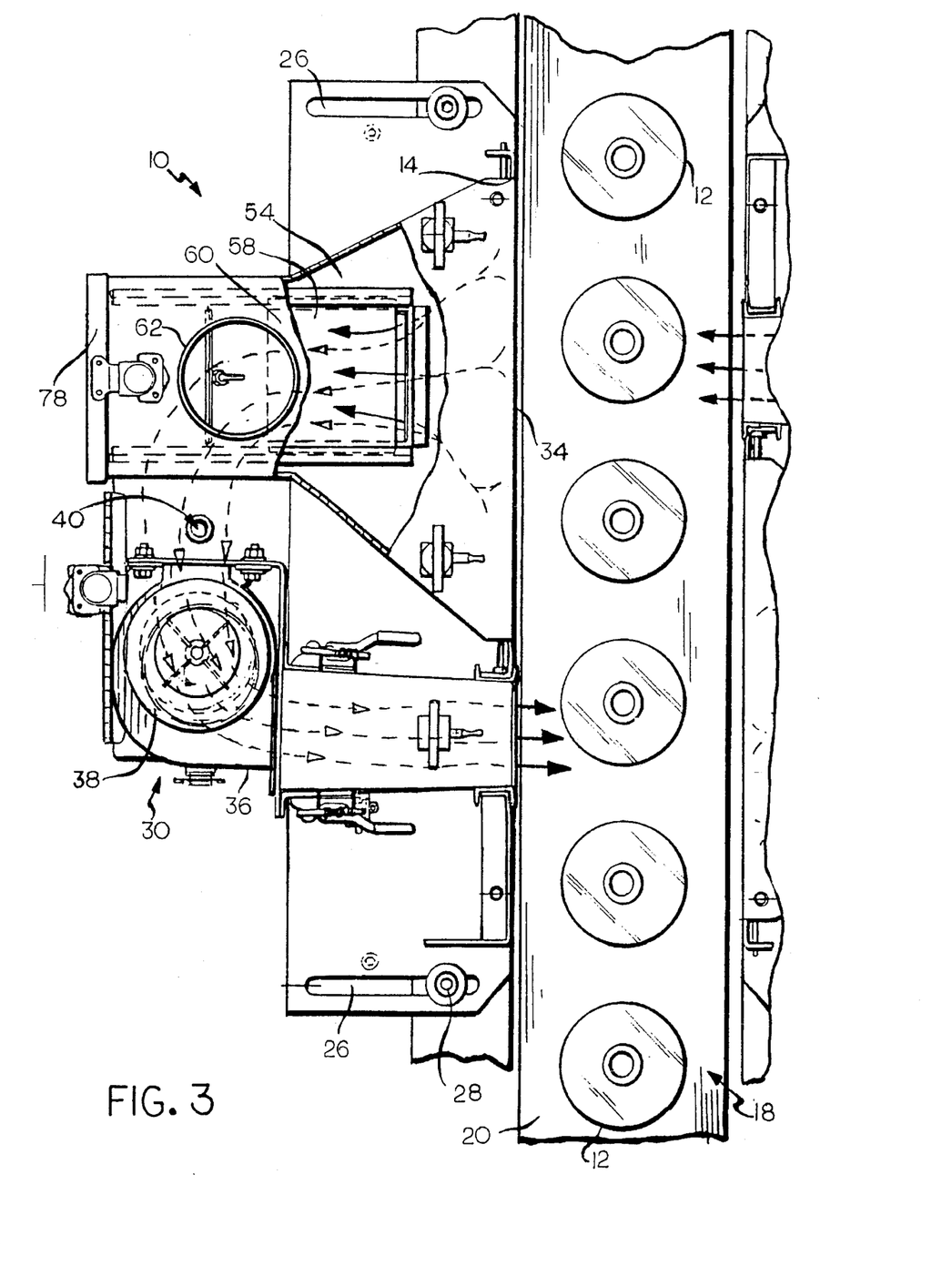
FIG. 3 is a partial enlarged top view of the hood of FIG. 1.
Figure 6:
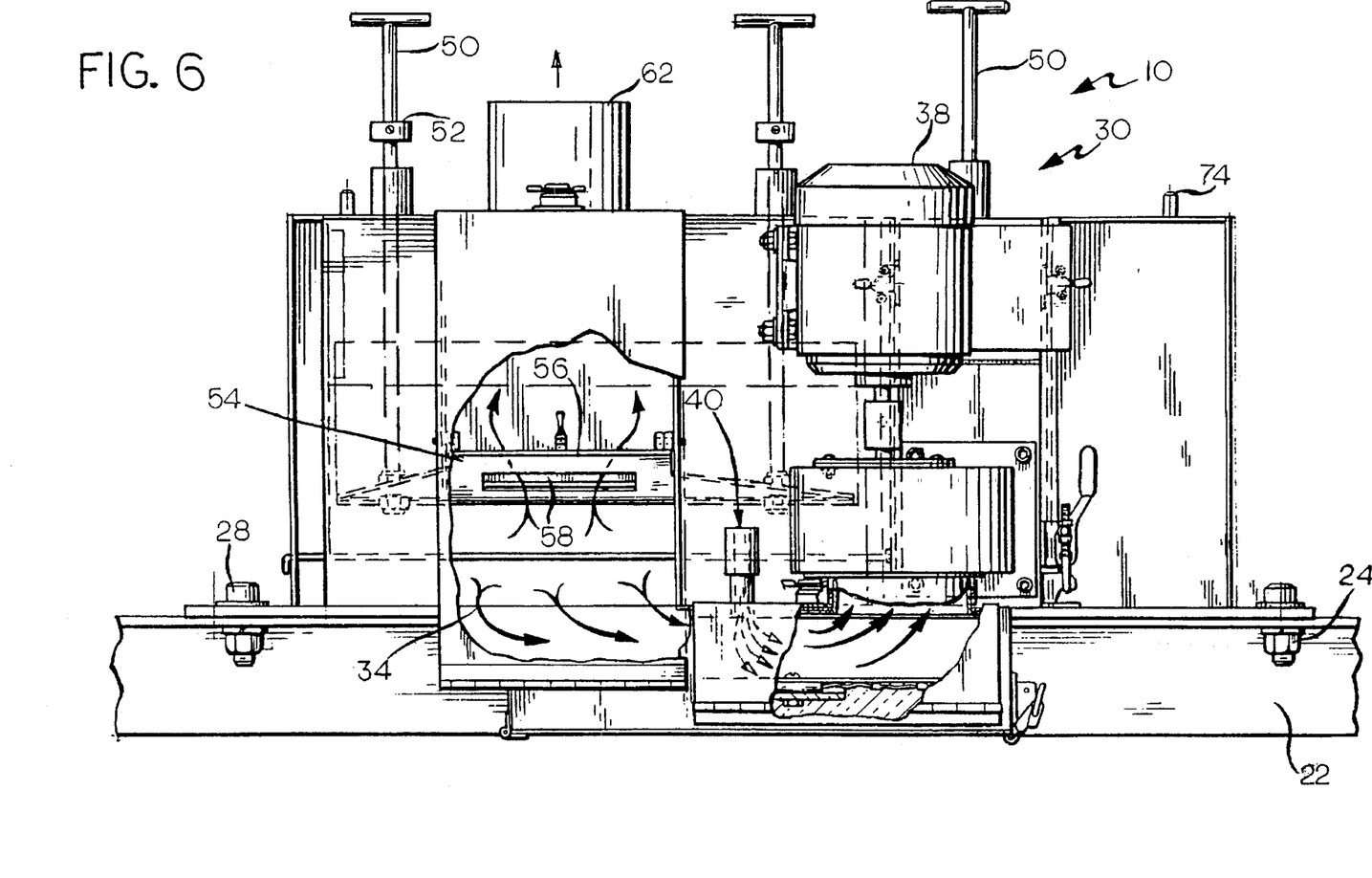
FIG. 6 is a side view of the hood of FIG. 1.

To further control vapor flow within the tunnel 18, the vapor outlet baffle also includes an adjustable flow divider 54 internally thereof for dividing the air flowing into the outlet into a first portion to be exhausted from the tunnel and a second portion to be recirculated back through the duct system 36 and vapor inlets 32 into the tunnel. As shown in FIGS. 3, 6 and 7, the flow divider 54 includes a damper 56 having an aperture 58 formed therein which is covered by a sliding gate 60 to provide an adjustable opening within the flow divider. When the sliding gate 60 is opened an amount as desired, the aperture 58 is in communication through the duct system 36 to an exhaust system 62 to exhaust a controlled portion of vapor with the remainder of the vapor being recycled to the vapor inlet 32. By placing the exhaust within the vapor outlet 34 the vapor flow pattern within the tunnel 18 is not adversely affected by the exhaust system low pressure as was the case for previous designs where the exhaust system drew directly from the tunnel, e.g., hood designs wherein the exhaust is positioned above the single line of glass containers. In addition, by exhausting from the vapor stream that is recirculated, improved control of the coating process may be achieved resulting in a higher concentration of coating vapors in the proximity of the container sidewalls and a lower or zero concentration in the proximity of the glass container finish. Moreover, a hood in accordance with the present invention has been found to provide a consistent uniform coating thickness about the circumference and height of a glass container and require substantially less metal compound than previous hood designs.

Figures 4, 5:
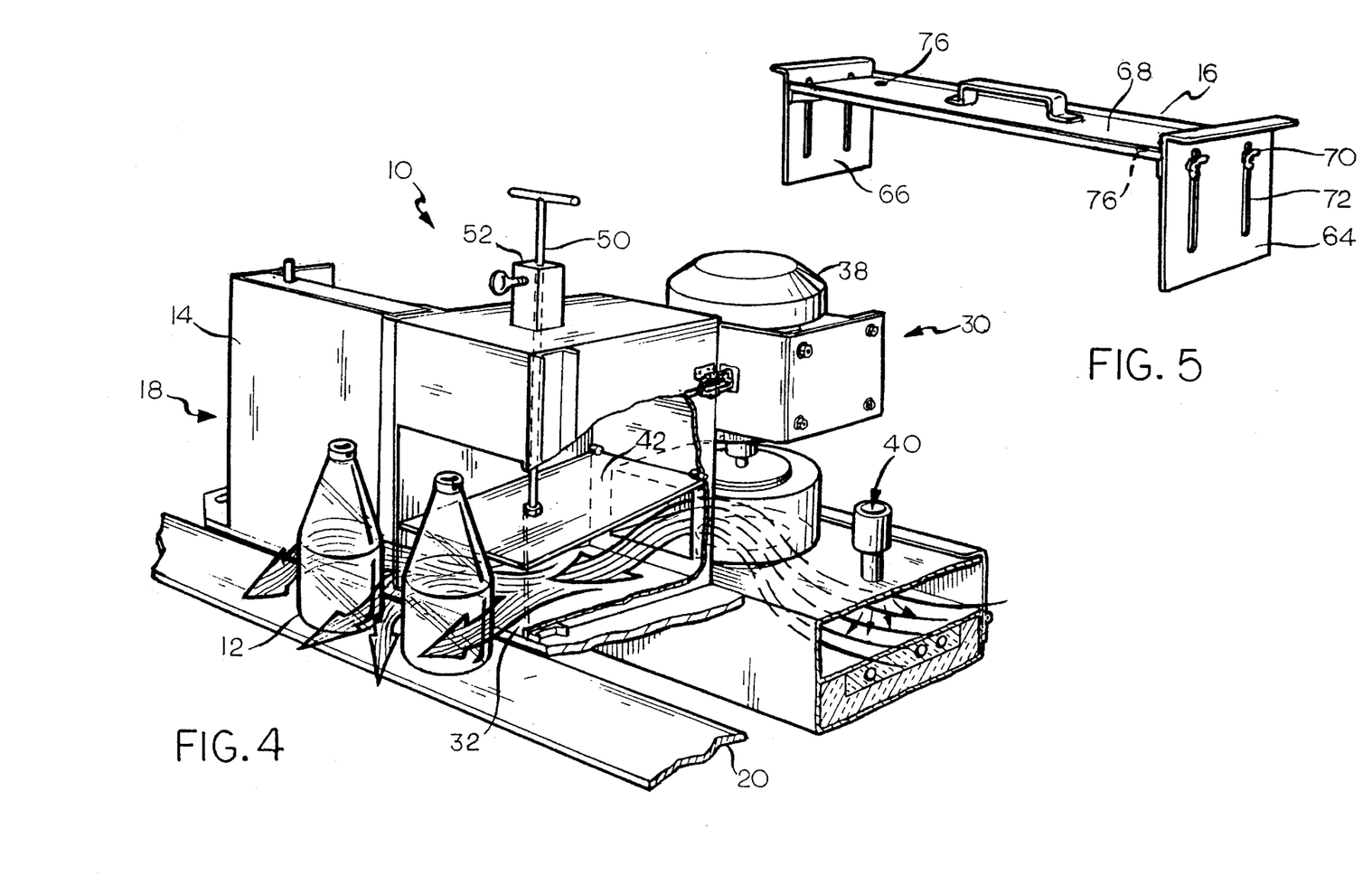
FIG. 4 is a partial perspective sectional view of the hood of FIG. 1.
FIG. 5 is a perspective view of an alternative cover for the hood of FIG. 1.

As shown in FIGS. 1 and 5, the roof 16 of the hood 10 is designed to accommodate glass containers 12 of varying height. The roof 16 includes a slotted front plate 64 and a slotted back plate 66 and a cover 68 extending between the front plate and the back plate. The cover 68 may be substantially flat (FIG. 5) or the cover may include an arched member (FIG. 1). Fasteners 70 extend through ears of the cover 68 and into slots 72 so that the roof 16 may be adjusted vertically relative to the glass containers 12 thereby allowing the hood 10 to accommodate glass containers of varying heights. The roof 16 rests on the top edge of the side walls 14 and is maintained in position through posts 74 extending from the sidewalls within holes 76 in the cover 68.

In the metal-oxide coating process the circulating vapors can become quite hot, and in such cases, buildup of a metal-oxide crust may occur on the inside of the side walls 14 and duct system 36 of the hood 10. Accordingly, various clean out doors 78 of a type well known in the art may be used to provide access to the hood 10.

It will be appreciated that the present invention may function under a wide range of operating conditions depending on the type of glass containers to be coated and the speed that the glass containers travel through the tunnel. In addition, various control devices, fasteners and the like which are conventional and standard in the glass container manufacturing art, apart from the invention as described and claimed, may have been omitted for purposes of clarity in illustrating and describing the invention. Accordingly, reference may be made to the glass manufacturing literature generally for detailed descriptions of the various control devices, fasteners, glass manufacturing equipment, structures and conditions as appropriate.

The documents, patents and patent applications referred to herein are hereby incorporated by reference.

Having described presently preferred embodiments of the invention, it is to be understood that it may be otherwise embodied within the scope of the appended claims.

What is claimed is:

1. Apparatus for applying a coating compound to hot, freshly formed glass containers comprising:

a) wall means including spaced apart side walls defining an elongate tunnel;

b) conveyor means for conveying said hot, freshly formed glass containers through said tunnel; and c) distribution means for causing a plurality of warm vapor streams each containing a coating compound to flow laterally across said tunnel, said distribution means comprising;

a series of vapor inlets arranged along each said side wall of said tunnel, a series of vapor outlets arranged along each said side wall of said tunnel, said vapor inlets and said vapor outlets along each said side wall of said tunnel being positioned alternatively with one another along each said side wall, each said vapor inlet along one said side wall of said tunnel being positioned opposite to one said vapor outlet on the other said side wall of said tunnel, each said vapor inlet and outlet having a pivotable baffle positioned internally thereof and effective to vary the vertical extent of an opening of each said vapor inlet and each said vapor outlet into said tunnel, and each said vapor outlet having adjustable flow divider means positioned internally thereof for dividing vapor streams flowing within said vapor outlet into a first portion to be exhausted from said vapor outlet and a second portion to be recirculated through said vapor inlet into said tunnel;

wherein each said vapor inlet is in communication with a corresponding one of said vapor outlets along said side wall through a duct system having a motor driven blower to circulate vapor streams from said tunnel through said corresponding one of said vapor outlets and out said vapor inlet which is in communication with said corresponding one of said vapor outlets and into said tunnel;

wherein said vapor streams contain a metal compound;

wherein said metal compound is vaporized upon contact with a circulating carrier gas which has been heated above a vaporization temperature of said metal compound;

wherein each said vapor inlet is located adjacent said corresponding one of said vapor outlets;

wherein an operating width of each said vapor outlet is substantially wider than an opening width of each said vapor inlet; and wherein each said baffle is pivotally fixed about a first rod extending through sides of said apparatus and hingedly connected to a front plate which slides within two vertical channels of said apparatus and is effective to vary the vertical extent of said opening into said tunnel.

2. The apparatus of claim 1 wherein vapor streams are circulated from one of said vapor inlets across the glass container and into a corresponding one of said vapor outlets of an opposing said side wall through said duct system and out said vapor inlet which is in communication with said corresponding one of said vapor outlets and across another glass container and into another one of said vapor outlets.

3. The apparatus of claim 1 wherein a second rod is fixed to a top of each said baffle and extends from said baffle through a top of said apparatus such that the position of said baffle and vertical extent of said opening may be adjusted by moving said second rod vertically.

4. The apparatus of claim 3 wherein said flow divider means includes a damper having an aperture formed therein, said aperture having a sliding gate to provide an adjustable opening, said aperture in communication through said duct system to an exhaust system to exhaust a controlled portion of said vapor streams.

5. The apparatus of claim 4 further comprising a roof, said roof including a slotted front plate and a slotted back plate and a cover extending between said front plate and said back plate, said roof capable of being adjusted vertically relative to the glass containers thereby allowing the apparatus to accommodate glass containers of varying height.

6. Apparatus for applying a metal oxide coating to hot, freshly formed glass containers comprising:

a) a tunnel including spaced apart side walls and a roof;

b) a conveyor for conveying said hot, freshly formed glass containers through said tunnel; and c) a vapor distributor including;

a series of alternating vapor inlets and vapor outlets arranged along each said side wall of said tunnel, each said vapor inlet along one said side wall of said tunnel being positioned opposite to a vapor outlet on the other said side wall of said tunnel, each said vapor inlet and vapor outlet having a pivotable baffle positioned internally thereof, each said baffle being effective to vary the vertical extent of an opening of each said vapor inlet and said vapor outlet into said tunnel, and each said baffle having an adjustable flow divider internally thereof for dividing a vapor flowing into each said vapor outlet into a first portion to be exhausted from said tunnel and a second portion to be recirculated through said vapor inlets into said tunnel.

7. The apparatus of claim 6 wherein each said vapor inlet is in communication with a corresponding said vapor outlet through a duct system having a motor driven blower to circulate vapors from said tunnel through said corresponding vapor outlet and out said vapor inlet into said tunnel.

8. The apparatus of claim 6 wherein said vapor is circulated from each said vapor inlet across the glass container conveyed on said conveyor and into each said vapor outlet positioned opposite each said vapor inlet on said other side wall through a duct system and out a corresponding said vapor inlet which is in communication with said vapor outlet and across another glass container and into a vapor outlet which is positioned opposite said corresponding vapor inlet and on the other side wall.

9. The apparatus of claim 6 wherein said vapor contains a metal compound selected from the group consisting of tin tetrachloride, titanium tetrachloride, and tetraisopropyl titanate.

10. The apparatus of claim 9 wherein each said vapor inlet is located adjacent and contiguous each said vapor outlet.

11. The apparatus of claim 10 wherein a width of said opening of said vapor outlet is substantially wider than a width of said opening of said vapor inlet.

12. The apparatus of claim 11 wherein each said baffle is pivotally fixed about a first rod extending through sides of said apparatus and hingedly connected to a front plate which slides within two vertical channels of said apparatus and is effective to vary the vertical extent of said opening into said tunnel.

13. The apparatus of claim 12 wherein a second rod is fixed to a top of each said baffle and extends from said baffle through a top of said apparatus such that the vertical extent of said opening may be adjusted by moving said rod of each said baffle vertically.

14. The apparatus of claim 13 wherein said flow divider includes a damper having an aperture formed therein, said aperture having a sliding gate to provide an adjustable opening, said aperture in communication with an exhaust system to exhaust a controlled portion of said vapor.

* * * * *